United States Patent [19]

Jang

[11] Patent Number: 5,767,927
[45] Date of Patent: Jun. 16, 1998

[54] LIQUID CRYSTAL DISPLAY WITH PIXEL ELECTRODE DIVIDED IN TWO BY COMMON ELECTRODE LINE

[75] Inventor: Seok-Pil Jang, Kyungki-do, Rep. of Korea

[73] Assignee: LG Semicon Co., Ltd., Chungcheonbuk-Do, Rep. of Korea

[21] Appl. No.: 733,096

[22] Filed: Oct. 16, 1996

[30] Foreign Application Priority Data

Oct. 20, 1995 [KR] Rep. of Korea ............... 1995/36366

[51] Int. Cl.⁶ .................... G02F 1/1343; G02F 1/136
[52] U.S. Cl. ..................... 349/39; 349/38; 349/47
[58] Field of Search ........................ 349/38, 39, 47

[56] References Cited

U.S. PATENT DOCUMENTS 5,151,806  9/1992  Kawamoto et al. ............... 349/39
5,394,258  2/1995  Morin et al. ...................... 349/38

*Primary Examiner*—Anita Pellman Gross
*Attorney, Agent, or Firm*—John P. White; Cooper & Dunham LLP

[57] ABSTRACT

Liquid crystal display which increases a numerical aperture, and a method for fabricating the same are disclosed, the liquid crystal display including a plurality of semiconductor layers each formed in a pixel region on a substrate, each of semiconductor layers connected with a data line, and each of semiconductor layers having a source region and a drain region, a common electrode line formed on each semiconductor layer to overlap the semiconductor layer, and a pixel electrode formed in the pixel region excluding the gate line, the date line, and the common electrode in contact with the semiconductor layer.

3 Claims, 5 Drawing Sheets

Light

LIQUID CRYSTAL DISPLAY WITH PIXEL ELECTRODE DIVIDED IN TWO BY COMMON ELECTRODE LINE

BACKGROUND OF THE INVENTION

1. Field of the Invention

The present invention relates to a liquid crystal display and, more particularly, to a liquid crystal display which is suitable for improving numerical aperture, and a method for manufacturing the same.

2. Discussion of the Related Art

A conventional liquid crystal display will be discussed with reference to the attached drawings.

FIG. 1 is a layout of a conventional liquid crystal display.

Referring to FIG. 1, a gate line 14 and a data line 16 are formed to cross each other, and a pixel electrode 18 is formed in a pixel region formed by the intersection of the gate lines 14 and the data lines 16. The pixel electrode is formed not to overlap the gate line 14a and the data line 16 which are adjacent to the pixel electrode 18. In the pixel region, a common electrode line 14a is formed in parallel with the gate line 14. A black matrix 20 formed on the gate line 14 and the data line 16 overlaps the pixel electrode 18.

FIGS. 2a–2d illustrate sectional views across the line A—A' showing process steps of the method for fabricating the conventional liquid crystal display.

Referring to FIG. 2a, polysilicon is formed on a transparent insulating substrate 11, such as glass or quartz and is patterned so as to form a semiconductor layer 12 of an island form in the transistor region and the pixel region. A gate insulating film 13 is formed on the semiconductor layer 12, and a metal film is formed on the gate insulating film 13 and is patterned so that a gate line is formed on the top of the semiconductor layer 12 in the thin film transistor region. With the gate line 14 used as a mask, impurity ions, e.g., phosphorus or boron are injected into the semiconductor layer 12 to be heat treated so as to form a source region and a drain region in the semiconductor layer 12 in the thin film transistor region.

Referring to FIG. 2b, a metal film is formed and patterned, to form a common electrode line 14a in the storage capacitor region in the pixel region, and a first interlayer insulating film 15 is formed on entire substrate surface of the including the gate electrode 14, and then portions of the first interlayer insulating film 15 and the gate insulating film 13 over the source region are removed to form a first contact hole 15a such that the first contact hole 15a exposes the source region.

Referring to FIG. 2c, a metal film is formed on entire surface of the substrate 11 including the first interlayer insulating film 15 and is patterned, to form a data line 16 to be connected to the source region via the first contact hole 15a. A second interlayer insulating film 17 is formed on entire surface of the substrate including the data line 16 and portions of the first and second interlayer insulating films 15 and 17 over the drain region are removed to form a second contact hole 17a such that the contact hole 17a expose the drain region.

Referring to 2d, a transparent conductive film is formed on entire surface of the substrate 11 including the second interlayer insulating film 17 and is patterned so that a pixel electrode 18 is formed to be connected to the drain region via the second contact hole 17a. In this instant, the pixel electrode 18 must be formed not to overlap the data line 16 and the gate line 14. A protecting film 19 is formed on entire surface of the substrate 11 including the pixel electrode 18, and a black matrix is formed on the protecting film 19 to prevent leakage of lights. In this instant, the black matrix 20 is formed to cover the gate line 14 and the data line 16 and to overlap the pixel electrode 18. That is, since the mis-align of the black matrix 20 causes light to leak through a gap between the black matrix 20 and the pixel electrode 18, the peripheral portion of the black matrix 20 is formed to overlap the upper portion of the pixel electrode 18.

The aforementioned conventional liquid crystal display and the method for fabricating the same have the following problems.

First, since the black matrix is formed to overlap the upper portion of the pixel electrode, numerical aperture of the conventional liquid crystal display is reduced.

Second, the additional black matrix formation process prolongs its production time.

SUMMARY OF THE INVENTION

Accordingly, the present invention is directed to a liquid crystal display and a method for fabricating the same that substantially obviates one or more of problems due to limitations and disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

One object of the present invention is to provide a liquid crystal display and a method for fabricating the same, which can increase a numerical aperture.

Another object of the present invention is to provide a liquid crystal display and a method for fabricating the same, which can minimize formation of parasitic capacitors.

To achieve these and other advantages and in accordance with the purpose of the present invention, as embodied and broadly described, the liquid crystal display includes a plurality of semiconductor layers each formed in a pixel region on a substrate, each of semiconductor layers connected with a data line, and each of semiconductor layers having a source region and a drain region, a common electrode line formed on each semiconductor layer to overlap the semiconductor layer, and a pixel electrode formed in the pixel region excluding the gate line, the date line, and the common electrode in contact with the semiconductor layer.

In other aspect of the present invention, there is provided a method for fabricating a liquid crystal display including the steps of forming semiconductor layers in a thin film transistor region and a storage capacitor region of a substrate, forming a gate insulating film on the semiconductor layer and injecting impurity ions into the semiconductor layer in the storage capacitor region, forming a gate electrode over the semiconductor layer in the thin film transistor region and forming a common electrode over the semiconductor layer in the storage capacitor region, injecting impurity ions into the semiconductor layers for forming a source region and a drain region with the gate electrode used as a mask, forming a first interlayer insulating film on entire surface of the substrate including the gate electrode and forming a first contact hole to expose the source region, forming a metal electrode on a portion of the first interlayer insulating film to be connected to the source region via the first contact hole, forming a second interlayer insulating film on entire surface of the substrate including the metal electrode and forming second and third contact holes to expose the drain region, forming a transparent conductive film on entire surface of the substrate to be connected to the drain region via the second and third contact holes and forming a mask material on the transparent conductive film, exposing the mask material from the back of the substrate with the gate electrode, the common electrode and the metal electrode used as masks, and patterning the transparent electrode material with the patterned mask material used as a mask to form a pixel electrode and removing remained mask material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
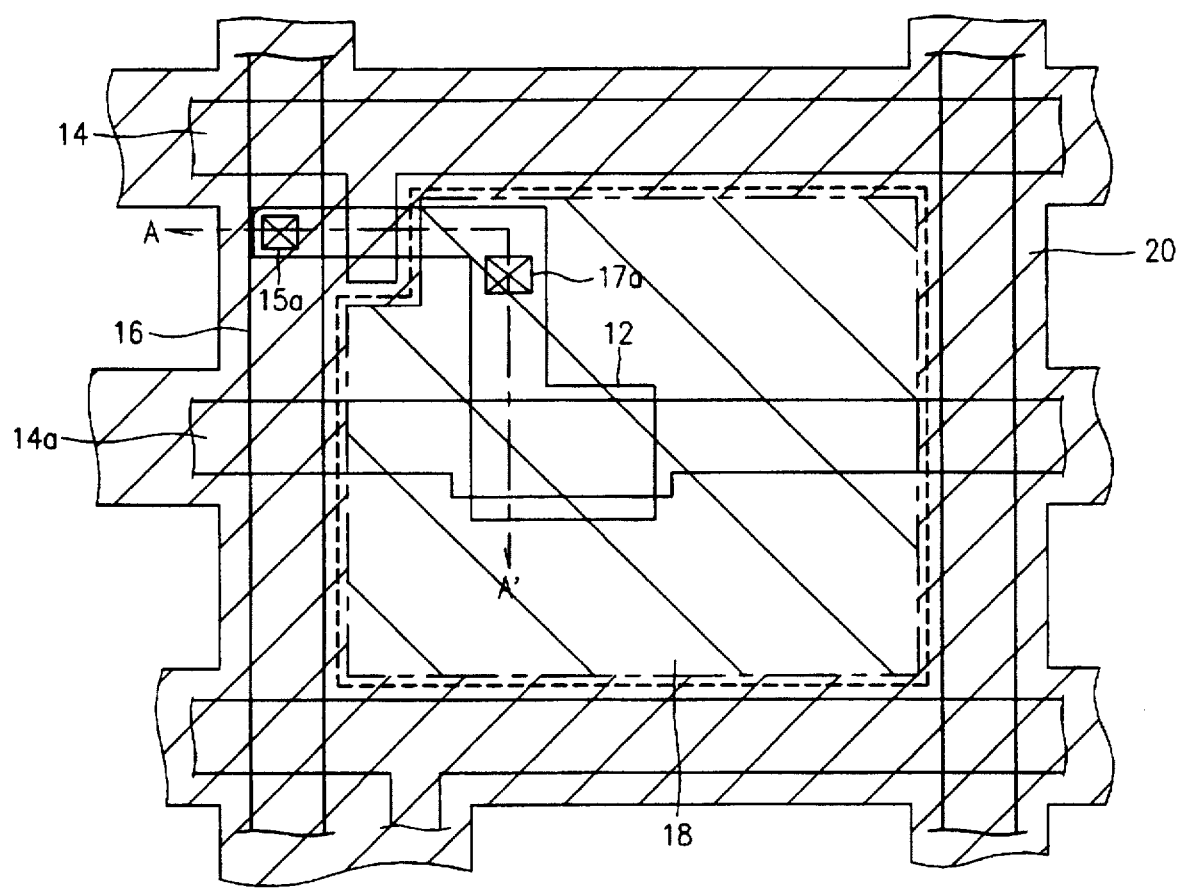
FIG. 1 is a layout of a conventional liquid crystal display.
Figure 2A:
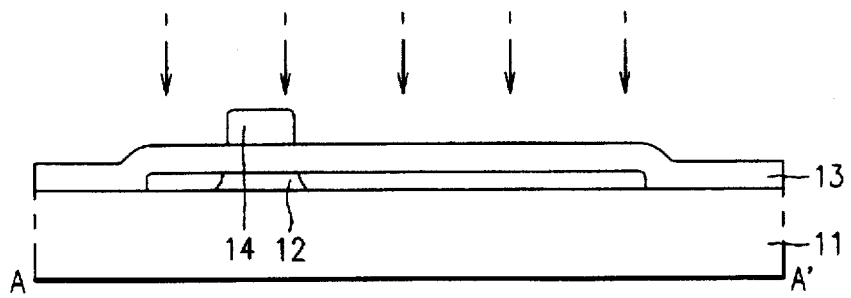
FIGS. 2a–2d illustrate sectional views across line A—A' of FIG. 1 showing process steps of a method for fabricating a liquid crystal display.
Figure 2B:
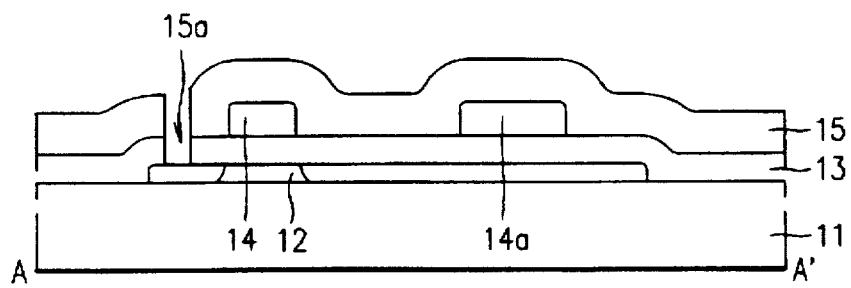
Figure 2C:
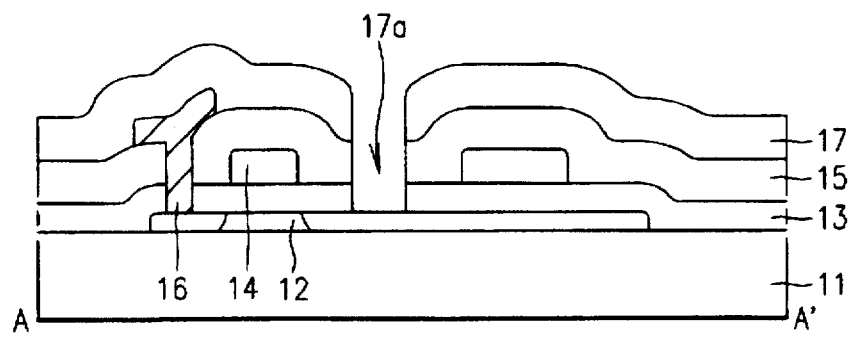
Figure 2D:
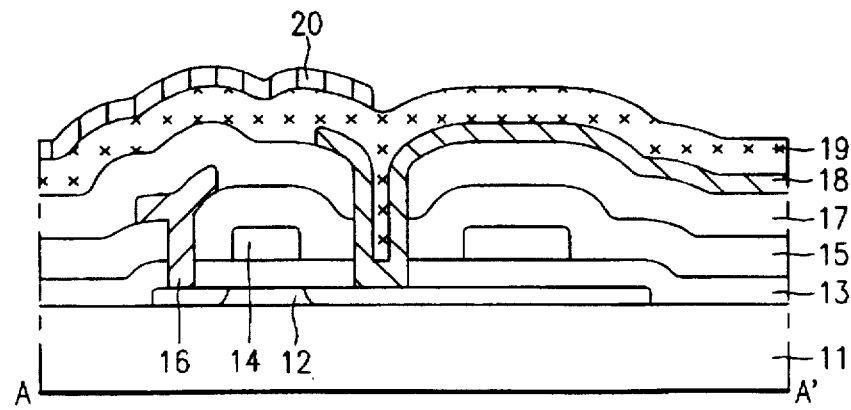
Figure 3:
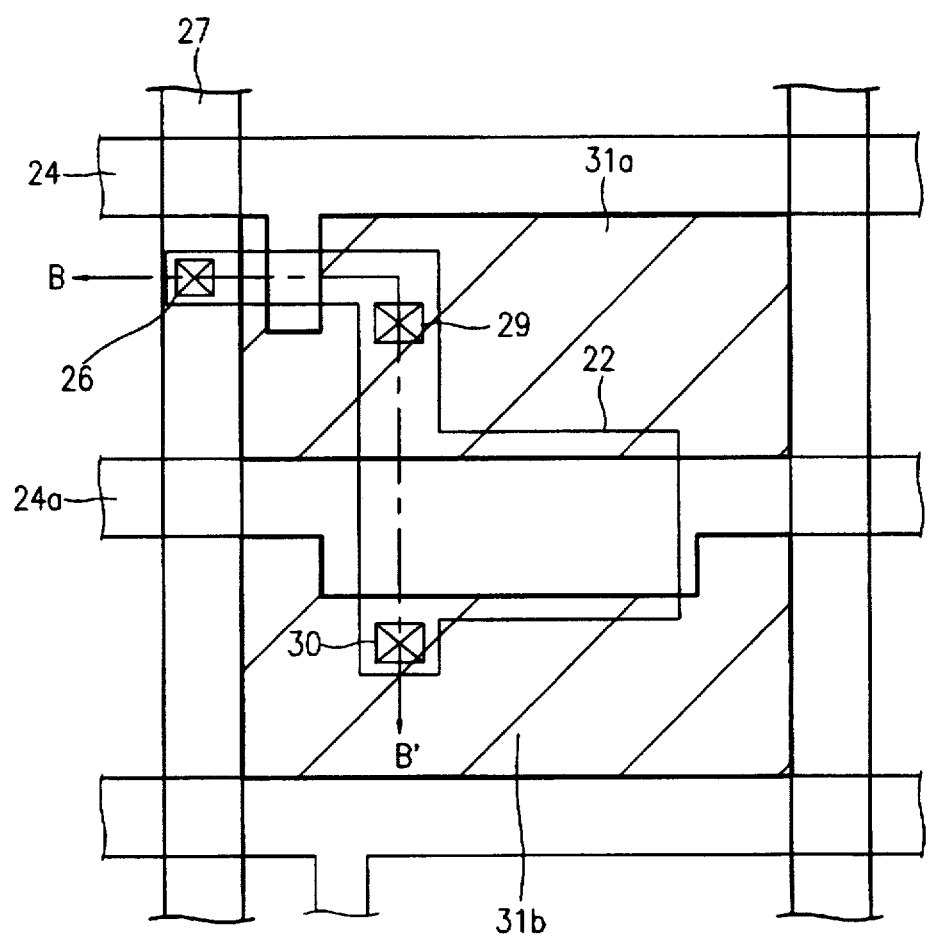
FIG. 3 is a layout of a liquid crystal display in accordance with a preferred embodiment of the present invention.

FIG. 3 is a layout of the liquid crystal display in accordance with a preferred embodiment of the present invention.

Referring to FIG. 3, a plurality of data lines and gate lines are arranged crossing the other, with a matrix of pixel regions formed surrounded by the data lines and the gate lines. A semiconductor layer 22 is formed to have a source region and a drain region on a substrate in each pixel region in contact with the data line 27. A common electrode 24a is formed on the semiconductor layer 22 to overlap the semiconductor layer 22, and pixel electrodes 31a and 31b are formed in contact with the semiconductor layer 22 in the pixel region except the gate line 24, the data line 27, and the common electrode line 24a. In this instant, the common electrode line 24a is formed in a unit in parallel with the gate line 24 and the pixel electrodes 31a and 31b are formed divided into two by the common electrode line 24a. The two pixel electrodes 31a and 31b are in contact with the semiconductor layer 22.

FIGS. 4a–4g illustrate sectional views across line B—B' of FIG. 3 showing process steps of a method for fabricating the liquid crystal display in accordance with a preferred embodiment of the present invention.

Figure 4A:
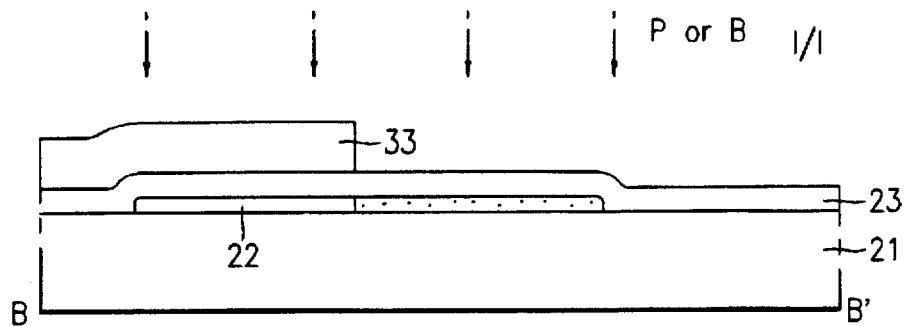
FIGS. 4a–4g illustrate sectional views across line B—B' of FIG. 3 showing process steps of a method for fabricating a liquid crystal display

Referring to FIG. 4a, a polysilicon is formed on a transparent insulating substrate 21 of such as glass and quartz and is patterned to form semiconductor layers 22 of an island form each of thin film transistor regions and pixel regions. A gate insulating film 23 is formed on the semiconductor layer 22, and a photoresist 33 is formed on the gate insulating film 23 and is patterned so that the upper portion of the semiconductor layer 22 in the storage capacitor region is exposed. With the photoresist used as a mask, impurity ions, such as phosphorus or boron are injected into the semiconductor layer 22 in the storage capacitor region. In this instant, the semiconductor layer 22 in the storage capacitor region is used as an underside electrode of the storage capacitor.

Figure 4B:
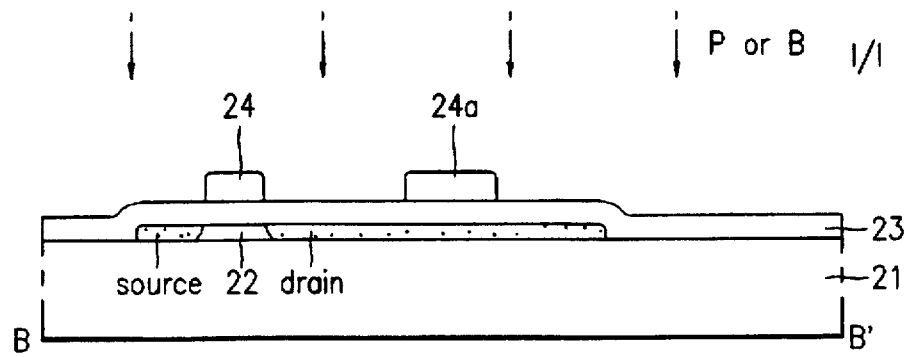

Referring to FIG. 4b, the photoresist 33 is removed and a metal film is formed on entire surface of the substrate and is patterned to form a gate line 24a and a common electrode line 24a on the semiconductor layer 22 in the thin film transistor region and the storage capacitor region, respectively. With the gate line 24 used as a mask, impurity ions, such as phosphorus or boron are injected into the semiconductor layer 22, which is heat treated, so that a source region and a drain region are formed in the semiconductor layer 22 in the thin film transistor region.

Figure 4C:
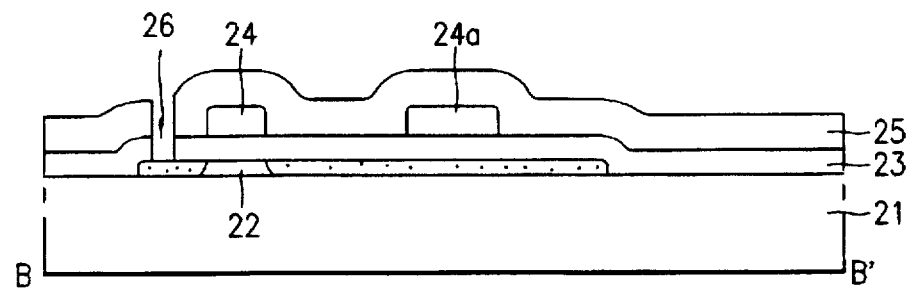

Referring to FIG. 4c, a first interlayer insulating film 25 is formed on entire surface of the substrate 21 including the gate electrode 24, and portions of the first interlayer insulating film 25 and the gate insulating film 23 over the source region are removed, to form a first contact hole 26 as to expose the source region.

Figure 4D:
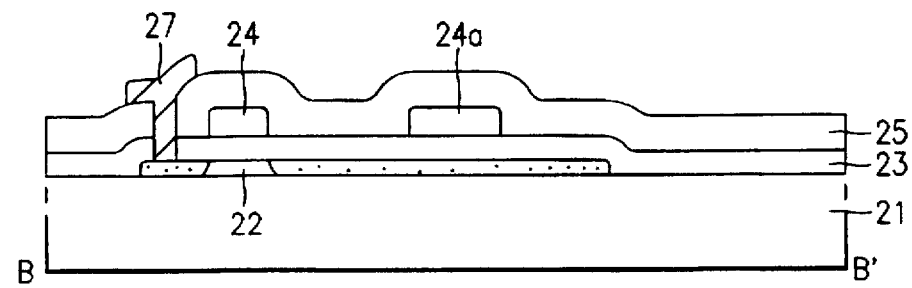

Referring to FIG. 4d, a metal film is formed on entire surface of the substrate 21 including the first interlayer insulating film 25 and is patterned, to form a data line 27 to be connected to the source region via the first contact hole 26.

Figure 4E:
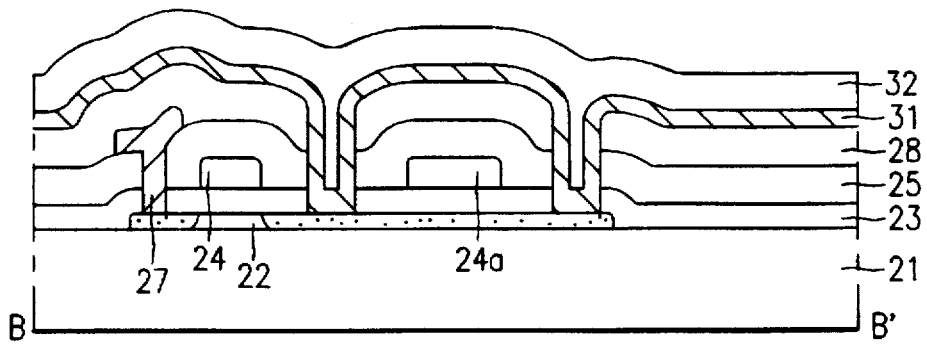

Referring to FIG. 4e, a second interlayer insulating film 28 is formed on entire surface of the substrate 21 including the data line 27, and portions of the first, and second interlayer insulating films 25 and 28 and the gate insulating film 23 over the drain region are removed, to form second and third contact holes 29 and 30 to expose the drain region. In this instant, the second and third contact holes 29 and 30 are formed spaced apart with the common electrode line in the middle. A transparent conductive film 31 such as ITO (Indium Tin Oxide) is formed on entire surface of the substrate 21 including the second and third contact holes 29 and 30, and a negative photoresist 32 is formed on the transparent conductive film 31.

Figure 4F:
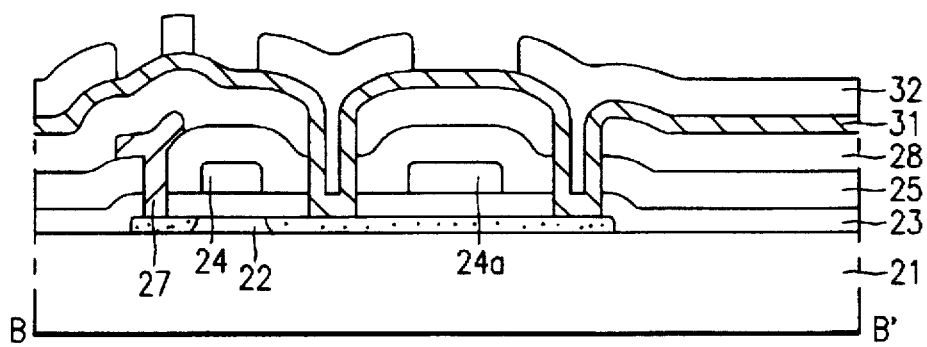

Referring to FIG. 4f, with the gate electrode 24 and the common electrode line 24a, the data line 27 used as masks, the negative photoresist 32 is exposed from behind to pattern the negative photoresist 32.

Figure 4G:
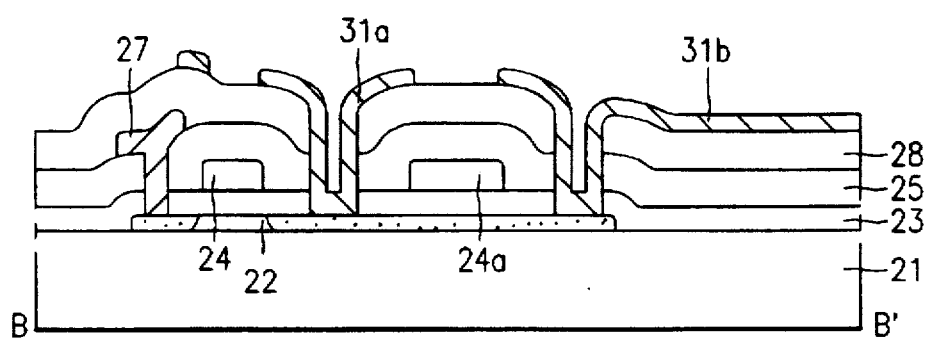

Referring to FIG. 4g, with the patterned photoresist 32 used as a mask, the transparent conductive film 31 is patterned to form pixel electrodes 31a and 31b, and remained photoresist 32 is removed.

As described above, the liquid crystal display of the present invention and the method for fabricating the same have the following advantages.

First, the precise patterning of the pixel electrodes by means of backside exposure not to overlap the data line, the gate line, and the common electrode line allows to manufacture the liquid crystal display which has an improved numerical aperture.

Second, since the pixel electrode is not overlapped with the data line and gate line, the formation of parasitic capacitors is reduced, whereby delay of signal transmission can be minimized and variation of the signals applied to the pixel electrodes can be reduced. Accordingly, the liquid crystal display and the method for fabricating the same of the present invention is suitable for application to manufacture a large-sized, high quality picture liquid crystal display.

It will be apparent to those skilled in the art that various modification and variations can be made in the method for fabricating a liquid crystal display unit of the present invention without departing from the spirit or scope of the inventions. Thus, it is intended that the present invention cover the modifications and variations of this invention provided they come within the scope of the appended claims and their equivalents.

What is claimed is:

1. A liquid crystal display in which a plurality of data lines and gate lines are arranged crossing each other, with a matrix of pixel regions formed surrounded by the data lines and the gate lines, the liquid crystal display comprising:

a plurality of semiconductor layers each formed in a pixel region on a substrate, each of the semiconductor layers connected with a data line, and each of the semiconductor layers having a source region and a drain region;

a common electrode line formed above each semiconductor layer to overlap the semiconductor layer; and, a pixel electrode formed in each pixel region excluding the gate lines, the data lines, and the common electrode line in contact with the semiconductor layer, wherein each pixel electrode is formed divided into two by the common electrode line.

2. A method for fabricating a liquid crystal display having a thin film transistor and a storage capacitor, comprising the steps of:

forming semiconductor layers in a thin film transistor region and a storage capacitor region of a substrate;

forming a gate insulating film on the semiconductor layer and injecting impurity ions into the semiconductor layer in the storage capacitor region;

forming a gate electrode over the semiconductor layer in the thin film transistor region and forming a common electrode over the semiconductor layer in the storage capacitor region, injecting impurity ions into the semiconductor layers for forming a source region and a drain region with the gate electrode used as a mask;

forming a first interlayer insulating film on the entire surface of the substrate including the gate electrode and forming a first contact hole to expose the source region;

forming a metal electrode on a portion of the first interlayer insulating film to be connected to the source region via the first contact hole;

forming a second interlayer insulating film on the entire surface of the substrate including the metal electrode and forming second and third contact holes to expose the drain region;

forming a transparent conductive film on the entire surface of the substrate to be connected to the drain region via the second and third contact holes and forming a mask material on the transparent conductive film;

exposing the mask material from the back of the substrate with the gate electrode, the common electrode and the metal electrode used as masks; and, patterning the transparent electrode material with the patterned mask material used as a mask to form a pixel electrode and removing remaining mask material.

3. The method as claimed in claim 2, wherein the mask material is formed of a negative photoresist.

* * * * *